(12) United States Patent
Fronheiser et al.

(10) Patent No.: US 9,614,058 B2
(45) Date of Patent: Apr. 4, 2017

(54) METHODS OF FORMING LOW DEFECT REPLACEMENT FINS FOR A FINFET SEMICONDUCTOR DEVICE AND THE RESULTING DEVICES

(71) Applicant: GLOBALFOUNDRIES Inc., Grand Cayman (KY)

(72) Inventors: Jody Fronheiser, Delmar, NY (US); Ajey P. Jacob, Albany, NY (US); Witold P. Maszara, Morgan Hill, CA (US); Kerem Akarvardar, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/860,276

(22) Filed: Sep. 21, 2015

(65) Prior Publication Data
US 2016/0013296 A1    Jan. 14, 2016

Related U.S. Application Data

(63) Continuation of application No. 13/839,998, filed on Mar. 15, 2013, now abandoned.

(51) Int. Cl.
*H01L 29/66* (2006.01)
*H01L 29/78* (2006.01)
(Continued)

(52) U.S. Cl.
CPC ...... *H01L 29/66795* (2013.01); *H01L 29/165* (2013.01); *H01L 29/267* (2013.01); *H01L 29/785* (2013.01); *H01L 29/7851* (2013.01)

(58) Field of Classification Search
CPC ........... H01L 21/823431; H01L 21/845; H01L 27/0886; H01L 27/10826; H01L 27/1211;
(Continued)

(56) References Cited

U.S. PATENT DOCUMENTS

2005/0184283 A1    8/2005   Maeda et al.
2009/0256208 A1   10/2009   Okano
(Continued)

FOREIGN PATENT DOCUMENTS

| TW | 200529434 A | 9/2005 |
| TW | 201110352 A | 3/2011 |
| TW | 201234589 A | 8/2012 |

OTHER PUBLICATIONS

Drowley et al., "Model for facet and sidewall defect formation during selective epitaxial growth of (001) silicon," Appl. Phys. Lett., 52:546-48, 1988.
(Continued)

*Primary Examiner* — Jarrett Stark
*Assistant Examiner* — Shahed Ahmed
(74) *Attorney, Agent, or Firm* — Amerson Law Firm, PLLC

(57) ABSTRACT

One illustrative device disclosed herein includes a substrate fin formed in a substrate comprised of a first semiconductor material, wherein at least a sidewall of the substrate fin is positioned substantially in a <100> crystallographic direction of the crystalline structure of the substrate, a replacement fin structure positioned above the substrate fin, wherein the replacement fin structure is comprised of a semiconductor material that is different from the first semiconductor material, and a gate structure positioned around at least a portion of the replacement fin structure.

18 Claims, 15 Drawing Sheets

(51) Int. Cl.
*H01L 29/165* (2006.01)
*H01L 29/267* (2006.01)

(58) Field of Classification Search
CPC ......... H01L 29/41791; H01L 29/66772; H01L 29/7831; H01L 29/66795; H01L 29/7851; H01L 29/785
USPC ............... 257/255, 288, 347, 365, 368, 369; 438/151, 197, 199, 486, 488, 585
See application file for complete search history.

(56) References Cited

U.S. PATENT DOCUMENTS

| | | |
|---|---|---|
| 2010/0176424 A1 | 7/2010 | Yeo et al. |
| 2011/0049613 A1 | 3/2011 | Yeh et al. |
| 2011/0147811 A1 | 6/2011 | Kavalieros et al. |
| 2012/0009744 A1 | 1/2012 | Inaba |
| 2012/0199888 A1* | 8/2012 | Dai ................. H01L 29/045 257/288 |
| 2013/0062699 A1* | 3/2013 | Zhu ................. H01L 29/66795 257/368 |
| 2014/0027860 A1 | 1/2014 | Glass et al. |

OTHER PUBLICATIONS

Paul, "Si/SiGe heterostructures: From material and physics to devices and circuits," Review Article submitted to Semicond. Sci. Technol.
Paul, "Silicon-Germanium Strained Layer Materials in Microelectronics," Advanced Materials, 11:191-204, 1999.
Office Action dated May 18, 2015 (received on May 20, 2015 by the Taiwanese associates) from Taiwan Intellectual Property Office for counterpart TW Patent Application No. 102148637, including translation, 12 pages total.
Translation of Official Communication from German Patent Application No. 10 2014 203 524.4 dated May 20, 2016.
Translation of Official Action dated Apr. 22, 2016 from Taiwanese Patent Application No. 102148637, filed on Dec. 27, 2013.
Translation of Official Action dated May 23, 2016 from Chinese Patent Application No. 201410099173.3, filed on Mar. 17, 2014.
Translation of TW Rejection Decision from the Taiwanese Patent Office from Taiwanese Patent Application No. 102148637 dated Dec. 27, 2013.
Translation of CN 2nd Office Action from the Chinese Patent Office for Chinese Patent Application No. 201410099173.3 dated Mar. 17, 2014.

* cited by examiner

METHODS OF FORMING LOW DEFECT REPLACEMENT FINS FOR A FINFET SEMICONDUCTOR DEVICE AND THE RESULTING DEVICES

BACKGROUND OF THE INVENTION

1. Field of the Invention

Generally, the present disclosure relates to the manufacture of FET semiconductor devices, and, more specifically, to various methods of forming low defect replacement fins for a FinFET semiconductor device and the resulting device structures.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region, a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed and in lowering operation currents and voltages of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a planar FET, there are so-called 3D devices, such as an illustrative FinFET device, which is a three-dimensional structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

One process flow that is typically performed to form FinFET devices involves forming a plurality of trenches in the substrate to define the areas where STI regions will be formed and to define the initial structure of the fins, and these trenches may be formed in the substrate during the same process operation for processing simplicity. In some cases, the trenches are desirably designed with the same pitch (for better resolution during lithography) and they are formed to the same depth and width (for processing simplicity and various functional requirements), wherein the depth of the trenches is sufficient for the needed fin height and deep enough to allow formation of an effective STI region. After the trenches are formed, a layer of insulating material, such as silicon dioxide, is formed so as to overfill the trenches. Thereafter, a chemical mechanical polishing (CMP) process is performed to planarize the upper surface of the insulating material with the top of the fins (or the top of a patterned hard mask). Thereafter, an etch-back process is performed to recess the layer of insulating material between the fins and thereby expose the upper portions of the fins, which corresponds to the final fin height of the fins.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance capability and reliability of such devices. Device designers are currently investigating using alternative semiconductor materials, such as so-called III-V materials, to manufacture FinFET devices which are intended to enhance the performance capabilities of such devices, e.g., to enable low-voltage operation. However, the integration of such alternative materials on silicon substrates (the dominant substrates used in the industry) is a non-trivial matter due to, among other issues, the large difference in lattice constants between such materials and silicon.

The present disclosure is directed to various methods of forming low defect replacement fins for a FinFET semiconductor device and the resulting device structures.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming low defect replacement fins for a FinFET semiconductor device and the resulting device structures. One illustrative device disclosed herein includes a substrate fin formed in a substrate comprised of a first semiconductor material, wherein at least a sidewall of said substrate fin is positioned substantially in a <100> crystallographic direction of the crystalline structure of the substrate, a replacement fin structure positioned above the substrate fin, wherein the replacement fin structure is comprised of a semiconductor material that is different from the first semiconductor material, and a gate structure positioned around at least a portion of the replacement fin structure.

Another illustrative device disclosed herein includes a substrate fin formed in a (100) substrate comprised of a first semiconductor material, wherein a long axis of the substrate fin is positioned in a <100> crystallographic direction of the crystalline structure of the (100) substrate, a replacement fin structure positioned above the substrate fin, wherein the replacement fin structure is comprised of a semiconductor material that is different from the first semiconductor material, and a gate structure positioned around at least a portion of the replacement fin structure.

Yet another illustrative device disclosed herein includes a substrate fin formed in a (110) substrate comprised of a first semiconductor material, wherein a long axis of the substrate fin is positioned in a <110> crystallographic direction of the crystalline structure of the (110) substrate, a replacement fin structure positioned above the substrate fin, wherein the replacement fin structure is comprised of a semiconductor material that is different from the first semiconductor material, and a gate structure positioned around at least a portion of the replacement fin structure.

One illustrative method disclosed herein involves forming a substrate fin in a substrate such that at least a sidewall of the substrate fin is positioned substantially in a <100> crystallographic direction of the substrate, forming a replacement fin above the substrate fin and forming a gate structure around at least a portion of the replacement fin.

Another illustrative method disclosed herein includes obtaining a (100) silicon substrate, forming a substrate fin in the substrate such that a long axis of the substrate fin is oriented at a relative angle of 45 degrees relative to a <010> direction of the (100) silicon substrate, forming a replacement fin above the substrate fin, and forming a gate structure around at least a portion of the replacement fin.

Yet another illustrative method disclosed herein includes obtaining a (110) silicon substrate, forming a substrate fin in the substrate such that a long axis of the substrate fin is oriented at a relative angle of 90 degrees relative to a <100> direction of the (110) silicon substrate, forming a replacement fin above the substrate fin, and forming a gate structure around at least a portion of the replacement fin.

BRIEF DESCRIPTION OF THE DRAWINGS

The disclosure may be understood by reference to the following description taken in conjunction with the accompanying drawings, in which like reference numerals identify like elements, and in which.

Figure 1A:
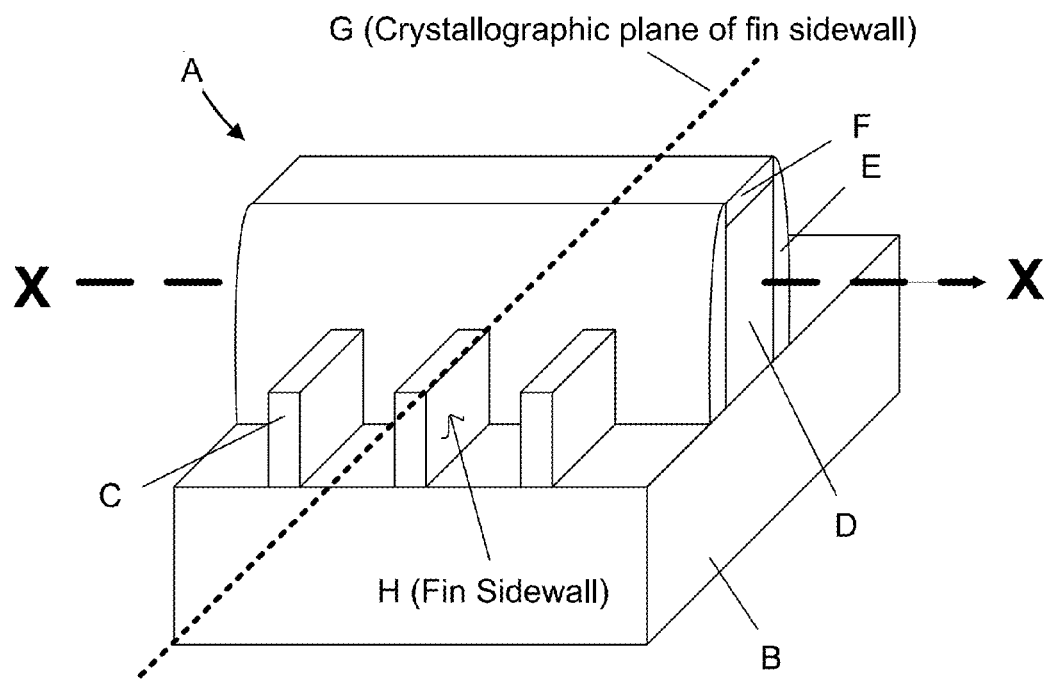
FIG. 1A depicts an illustrative example of a FinFET device with various features identified for reference purposes.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming low defect replacement fins for a FinFET semiconductor device and the resulting device structures. The method disclosed herein may be employed in manufacturing either an N-type device or a P-type device, and the gate structure of such devices may be formed using either so-called "gate-first" or "replacement gate" ("gate-last") techniques. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

FIG. 1A is a perspective view of a reference FinFET semiconductor device that is provided for reference purposes as it relates to several basic features of the FinFET device A. The FinFET device A is formed above a semiconductor substrate B. The FinFET device A includes a plurality of fins C, a gate electrode D, sidewall spacers E and a gate cap layer F. The sidewalls of the fins C is denoted by the letter H. The dashed line G depicts the long-axis or centerline of the fins C. View "X-X" in FIG. 1A depicts the locations where various cross-sectional views of the devices disclosed herein may be taken in the drawings discussed below, i.e., in a direction that is parallel to the long axis of the gate electrode D (the gate width direction). The portions of the fins C covered by the gate electrode D are the channel regions of the FinFET device A. In a conventional process flow, the portions of the fins C that are positioned in the source/drain regions may be increased in size or even merged together (not shown in FIG. 1A) by performing one or more epitaxial growth processes. The process of increasing the size of or merging the fins C in the source/drain regions of the device is performed to reduce the resistance of source/drain regions or to induce tensile or compressive stress in the channel area.

In general, the inventors have discovered that by orienting the sidewalls H and/or long axis G of the fins C of a FinFET device in a certain crystallographic orientation, the formation of replacement fin structures may be performed in such a manner that the resulting replacement fin structures contain relatively few, if any, substantial number of defects. In some cases, the resulting replacement fin structures may be substantially free of defects.

Figure 1B:
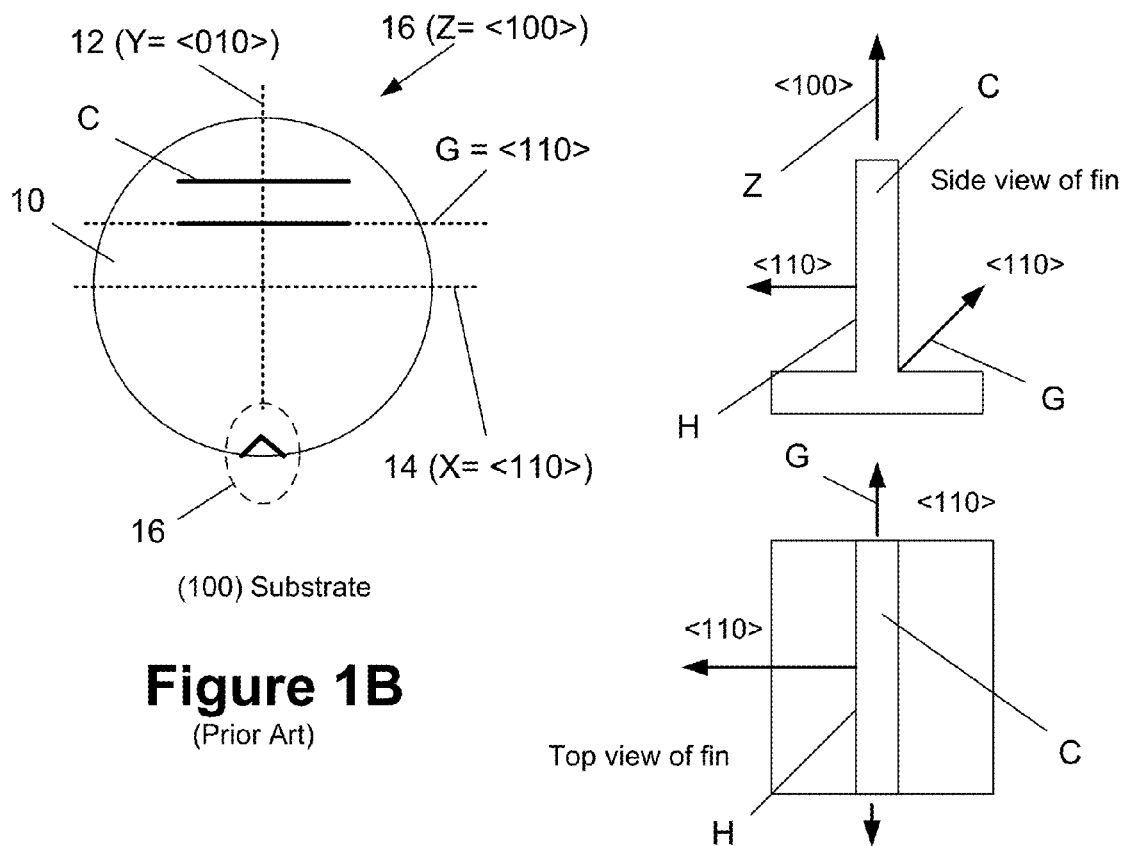
FIG. 1B depicts the orientation of the fins of an illustrative prior art FinFET device relative to the crystallographic orientation of an illustrative <100> substrate.

FIG. 1B depicts an illustrative prior art example of how the fins of a FinFET device may be oriented relative to the crystallographic orientation of the substrate material. FIG. 1B depicts an illustrative prior art substrate 10 having a (100) crystalline structure, wherein the use of "( )" denotes a specific plane. Such (100) substrates are well known in the art and are generally commercially available from a number of manufacturers. As is well known to those skilled in the art, the substrate 10 is manufactured in such a manner that the crystalline planes within the substrate 10 are arranged in a certain ordered arrangement. For example, FIG. 1B depicts a plan view of such an illustrative substrate 10 with a surface normal "Z" in the (100) crystalline plane. As depicted therein, the (100) substrate 10 has a <010> crystallographic direction in the "Y" or vertical direction 12 (in a plan view) and a <110> crystallographic direction in the "X" or horizontal direction 14 (in a plan view). As used herein, the "< >" designation reflects an identification of a family of equivalent directions. The (100) substrate 10 also has a <100> crystallographic direction in the "Z" direction i.e., in the direction into and out of the plan view drawing in FIG. 1B. The plan view in FIG. 1B also reflects how illustrative fins C of a FinFET device are typically oriented relative to various crystallographic structures of the (100) substrate 10. In general, the long axis G of the fins C are typically oriented in the <110> direction of the crystalline structure of the substrate 10. The substrate 10 includes an illustrative notch 16 that, in the depicted example, indicates the crystallographic direction in the "Y" or vertical direction 12 (in a plan view), i.e., the <010> crystallographic direction. Also depicted in FIG. 1B is a cross-sectional view and a top view of an illustrative fin structure C showing the crystalline orientation of various aspects of the fin C that is formed in the (100) substrate 10. As can be seen in these views, the long axis G of the fin C is positioned in the <110> crystallographic direction of the crystalline structure of the substrate 10, while the sidewalls H of the fins C are positioned in the <110> direction of the crystalline structure of substrate 10.

Figure 1C:
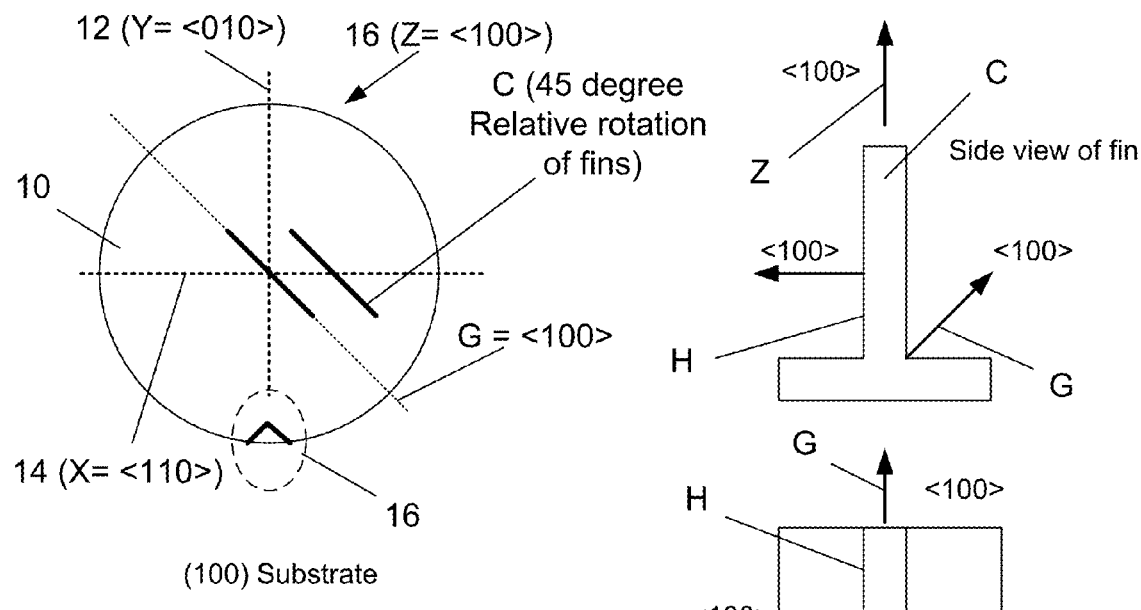
FIGS. 1C-1F depict various illustrative novel methods disclosed herein for forming low or substantially defect-free replacement fins for a FinFET semiconductor device, and various embodiments of the resulting novel devices.

FIG. 1C depicts one illustrative example disclosed herein wherein, in contrast to the prior art, the long axis or centerline G of the fins C are oriented in the <100> direction of a (100) substrate 10. This also positions the sidewall H of the fins C such that they are oriented in substantially the same <100> direction, depending upon the cross-sectional shape of the fins C. In the depicted example, this may be accomplished by orienting the long axis G of the fins C at a relative angle of +/−45 degrees relative to the "Y" axis of the substrate 10 toward the <011> crystalline direction of the substrate 10. Stated another way, the long axis G of the fins is rotated +/−45 degrees, in a relative sense, to the orientation of the fins C shown in FIG. 1B. This may be accomplished by maintaining the notch 16 of the substrate 10 in the depicted position and rotating the fins H such that the long axis or centerline G of the fins is rotated +/−45 degrees relative to the Y axis of the substrate 10, shown in FIG. 1C. As can be seen, with such rotation, the long axis G of the fins C and the upper surface of the fins H are all oriented in the <100> crystallographic orientation of the substrate 10, while the sidewalls H of the fins are positioned such that they are oriented in substantially the same <100> crystallographic orientation.

Figure 1D:
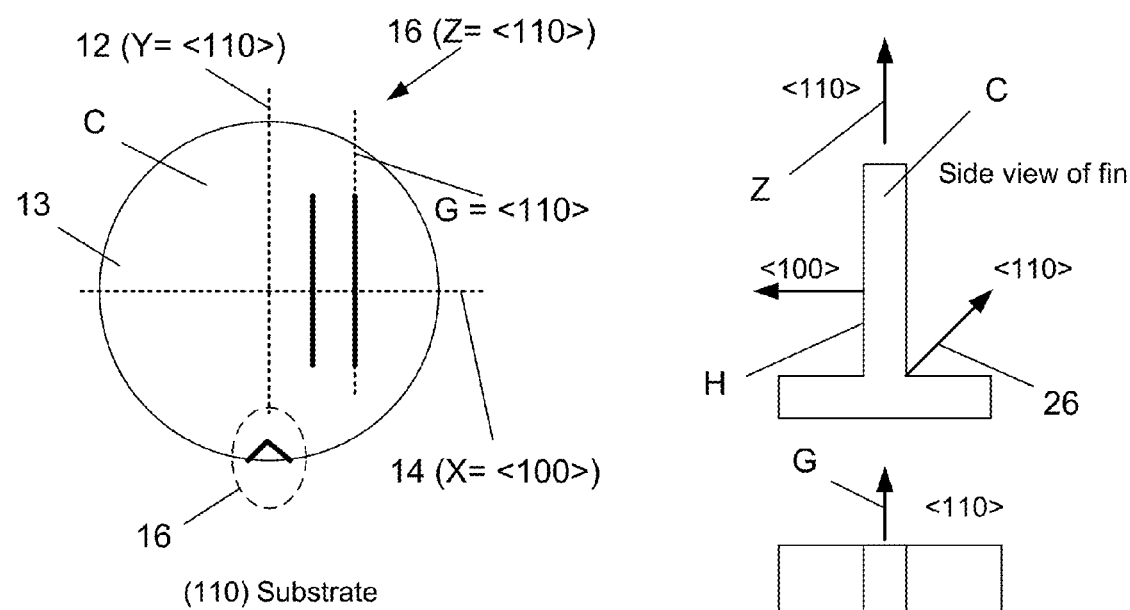

FIG. 1D depicts another illustrative example disclosed herein wherein, in contrast to the prior art, the long axis or centerline G of the fins C are oriented in the <110> direction of a (110) substrate 13, which may tend to improve mobility of electrons or holes for the FinFET devices. This arrangement also positions the sidewall H of the fins C such that they are positioned in a substantially <100> crystalline orientation, depending upon the cross-sectional shape of the fins C. In the depicted example, this may be accomplished by orienting the long axis G of the fins C in a direction that is at an angle of 90 degrees relative to the <100> direction of the (110) substrate.

Figure 1E:
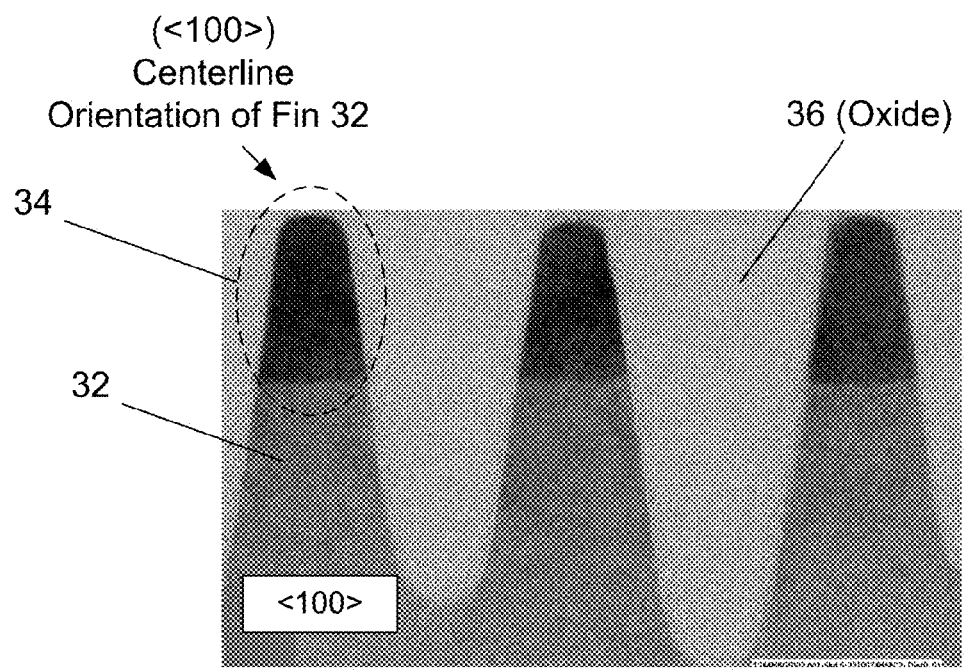

The inventors have discovered that, in the context of forming replacement fin structures, by orienting the sidewalls H of the substrate fins such that the sidewalls of the substrate fins are positioned substantially in a <100> direction of the crystalline structure of the substrate, the replacement fin structures may be formed such that they are substantially defect-free or contain a very low number of defects. The degree to which the sidewalls H of the fins C are positioned in exactly the <100> crystalline orientation depends upon the cross-sectional shape of the fins C. FIG. 1E is a TEM photograph of a device wherein the methods disclosed herein were employed in forming the device. In general, the device includes a plurality of substrate fins 32 and replacement fins 34 having an insulating material 36 positioned around the fins 32/34. In the device shown in FIG. 1E, the long axis G (fin centerline that runs into and out of the drawing page) of the substrate fins 32 were positioned in the <100> direction of a silicon substrate. In the case of the tapered substrate fins 32 shown in FIG. 1E, the sidewalls H of such tapered fins may be positioned slightly out of the <100> direction due to the tapered shape of the depicted fins. Of course, if desired, the substrate fins 32 may be manufactured to have more vertically oriented sidewalls or even substantially vertical sidewalls. The more vertical the sidewalls H of the substrate fins 32, the more closely they will be positioned in the <100> direction of the substrate. Thus, in stating that the long-axis or centerline G of the substrate fins 32 disclosed herein are positioned in the <100> direction of the substrate, it is intended to cover substrate fins so oriented irrespective of their cross-sectional configuration, i.e., irrespective of whether the substrate fins 32 are tapered or rectangular or any other shape when viewed in cross-section. In the depicted example, the replacement fins 34 were formed of silicon/germanium and they were formed by performing an epitaxial deposition process so as to form the replacement fins 34 on the substrate fins 32. The conditions of the epitaxial deposition process were as follows: a temperature of 450° C.; a pressure of 10 Torr; and a duration of about 10 minutes, using silane and germane as the precursor gases. Note the absence of any substantial defects in the replacement fins 34 shown in FIG. 1E.

Figure 1F:
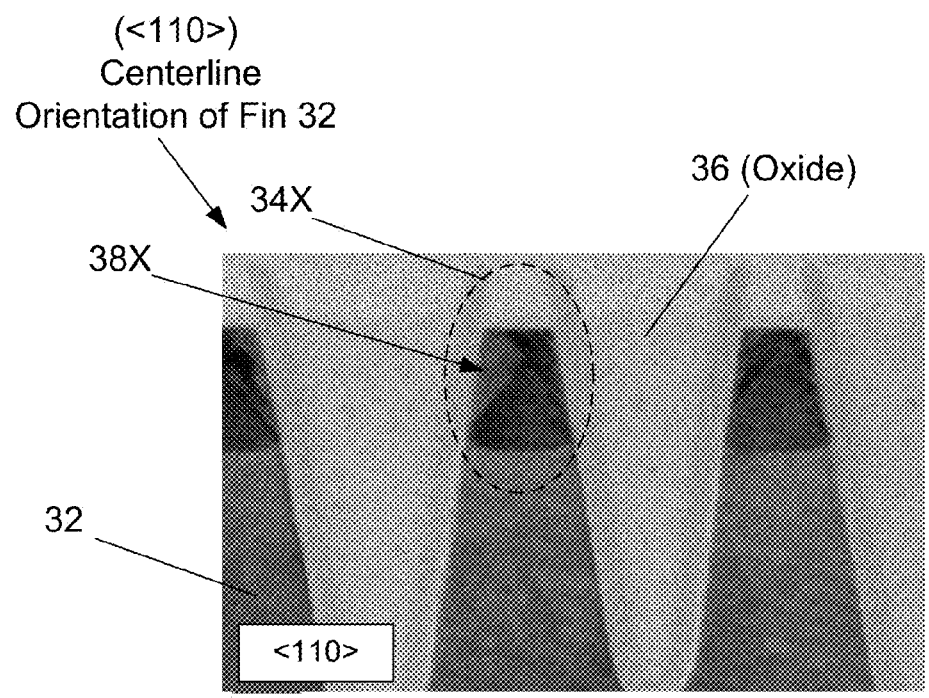

FIG. 1F is a TEM photograph of a device wherein the same methods that were used to form the replacement fins 34 shown in FIG. 1E were performed to form replacement fins 34X above the substrate fins 32. The only difference between the two embodiments shown in FIGS. 1E-1F is that, in the embodiment shown in FIG. 1F, the long axis of the substrate fins 32 was positioned in the <110> direction of the crystalline structure of the substrate. This also resulted in the sidewalls of the fins shown in FIG. 1F being positioned approximately in the same crystallographic orientation, i.e., <110>. Note the presence of the defects 38X in the replacement fins 34X shown in FIG. 1F.

The replacement fins disclosed herein may be formed using a variety of techniques. FIGS. 2A-2F depict various illustrative novel methods disclosed herein for forming low or substantially defect-free replacement fins for FinFET semiconductor devices employed in a CMOS application, and various embodiments of the resulting novel devices. In the attached drawings, the device 100 is depicted as being formed above a semiconductor substrate 102 comprised of a first semiconductor material, such as, for example, silicon, etc. The illustrative substrate 102 may be a bulk semiconductor substrate, or it may be the active layer of a so-called SOI (silicon-on-insulator) substrate or a so-called SGOI (silicon/germanium on insulator) substrate. Thus, the terms "substrate," "semiconductor substrate" or "semiconducting substrate" should be understood to cover all semiconductor materials and all forms of such semiconductor materials. The device 100 shown in FIGS. 2A-2F is comprised of a P-type FinFET device 100P and an N-type FinFET device 100N.

Figure 2A:
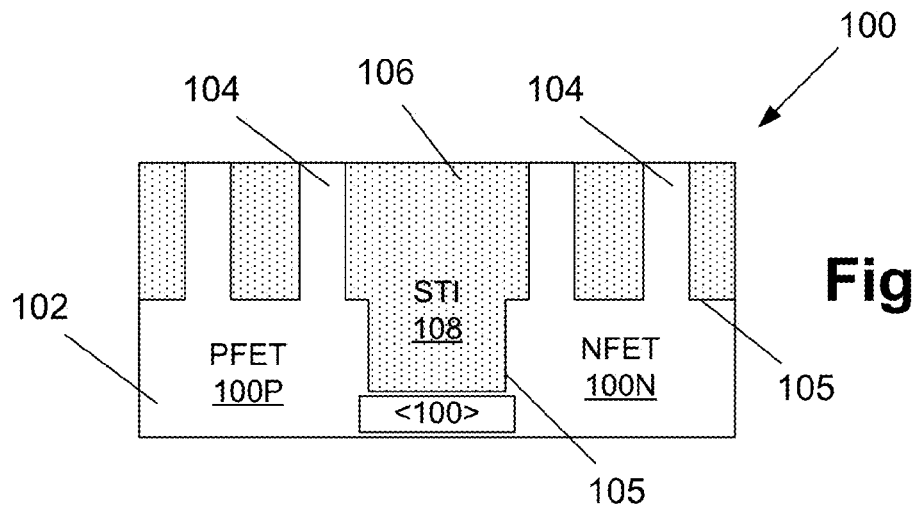
FIGS. 2A-2F depict various illustrative novel methods disclosed herein for forming low or substantially defect-free replacement fins for a FinFET semiconductor device employed in a CMOS application, and various embodiments of the resulting novel devices.

At the point of fabrication depicted in FIG. 2A, one or more etching processes were performed on the substrate 102 through a patterned etch mask (not shown) to define a plurality of trenches 105 in the substrate 102. The formation of the trenches 105 results in the formation of a plurality of substrate fins 104. Thereafter, the trenches 105 were overfilled with an insulating material 106 and a planarization process, e.g., a CMP process or an etch-back process, was performed to planarize the upper surface of the layer of insulating material 106 with the upper surface of the substrate fins 104. The aforementioned process operations also result in the formation of an illustrative trench isolation region 108 that electrically isolates the P-type FinFET device 100P from the N-type FinFET device 100N. Of course, as will be recognized by those skilled in the art after a complete reading of the present application, the isolation structure 108 may be formed before or after the substrate fins 104 are formed for the device 100. Importantly, in the attached drawings, a box with "<100>" contained therein signifies that at least the sidewalls of the substrate fins 104 are substantially oriented in the <100> crystallographic direction of the substrate 102. In some embodiments, the long axis G of the fins may also be oriented in the <100> direction of the substrate 102 (for a (100) substrate) or the long axis B may be oriented in the <110> direction of the substrate 102 (for a (110) substrate. That is, in the cross-sectional views shown herein, the sidewalls of the substrate fins 104 are substantially positioned in the <100> crystallographic direction of the substrate 102. The layer of insulating material 106 discussed herein may be comprised of a variety of different materials, such as, for example, silicon dioxide, silicon nitride, silicon oxynitride or any other dielectric material in common use in the semiconductor manufacturing industry, etc., or multiple layers thereof, etc., and it may be formed by performing a variety of techniques, e.g., chemical vapor deposition (CVD), etc.

The depth and width of the trenches 105 as well as the height and width of the substrate fins 104 may vary depending upon the particular application. In one illustrative embodiment, based on current day technology, the width of the trenches 105 may range from about 10 nm—several micrometers. In some embodiments, the substrate fins 104 may have a width within the range of about 5-30 nm. In the illustrative examples depicted in the attached figures, the trenches 105 and the substrate fins 104 are all of a uniform size and shape. However, such uniformity in the size and shape of the trenches 105 and the substrate fins 104 may not be required to practice at least some aspects of the inventions disclosed herein. In the example disclosed herein, the trenches 105 are depicted as having been formed by performing an anisotropic etching process that results in the trenches 105 having a schematically depicted, generally rectangular configuration with substantially vertical sidewalls. In an actual real-world device, the sidewalls of the trenches 105 may be somewhat inwardly tapered, although that configuration is not depicted in the attached drawings. In some cases, the trenches 105 may have a reentrant profile near the bottom of the trenches 105. To the extent the trenches 105 are formed by performing a wet etching process, the trenches 105 may tend to have a more rounded configuration or non-linear configuration as compared to the generally rectangular configuration of the trenches 105 that are formed by performing an anisotropic etching process. Thus, the size and configuration of the trenches 105, and the manner in which they are made, should not be considered a limitation of the present invention. For ease of disclosure, only the substantially rectangular trenches 105 will be depicted in subsequent drawings.

Figure 2B:
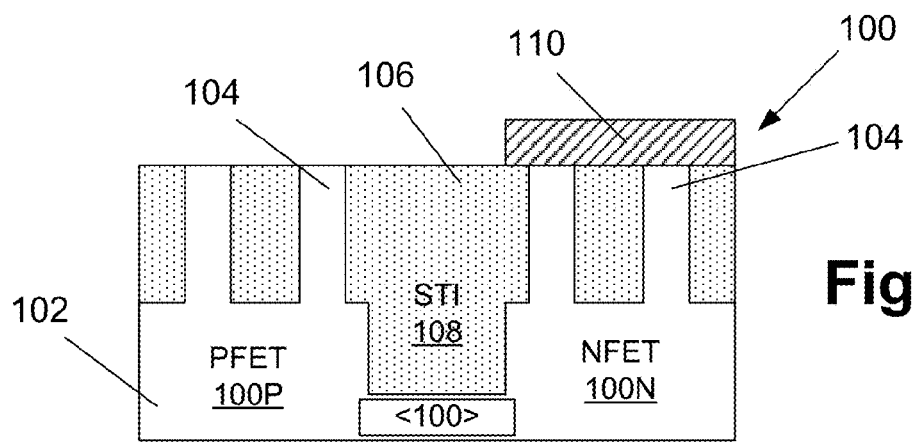

Next, as shown in FIG. 2B, a patterned masking layer 110 is formed that covers the N-type FinFET device 100N and exposes the P-type FinFET device 100P for further processing. The patterned masking layer 110 may be formed using known deposition, photolithography and etching techniques. The patterned mask layer 110 is intended to be representative in nature as it could be comprised of a variety of materials, such as, for example, a photoresist material, silicon nitride, silicon oxynitride, silicon dioxide, etc. Moreover, the patterned masking layer 110 could be comprised of multiple layers of material, such as, for example, a pad oxide layer (not shown) that is formed on the substrate 102 and a silicon nitride layer (not shown) that is formed on the pad oxide layer. Thus, the particular form and composition of the patterned masking layer 110 and the manner in which it is made should not be considered a limitation of the presently disclosed inventions. In the case where the patterned masking layer 110 is comprised of one or more hard mask layers, such layers may be formed by performing a variety of known processing techniques, such as a CVD process, an atomic layer deposition (ALD) process, an epitaxial deposition process (EPI), or plasma enhanced versions of such processes, and the thickness of such a layer(s) may vary depending upon the particular application. In one illustrative embodiment, the patterned masking layer 110 is a hard mask layer of silicon nitride that is initially formed by performing a CVD process to deposit a layer of silicon nitride and thereafter patterning the layer of silicon nitride using known photolithographic and etching techniques.

Figure 2C:
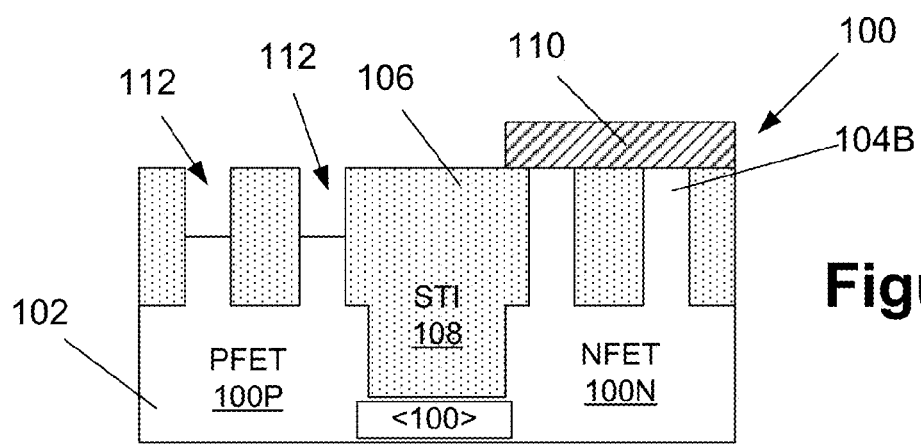

FIG. 2C depicts the device 100 after an etching process was performed to reduce the height of the substrate fins 104 for the P-type FinFET device 100P. The etching process results in the formation of recesses 112 above the reduced-height substrate fins 104. In one illustrative example, the recesses 112 may a depth on the order of about 10-200 nm (which depends on the critical thickness of the material being deposited) and an aspect ratio on the order of about 5:1.

Figure 2D:
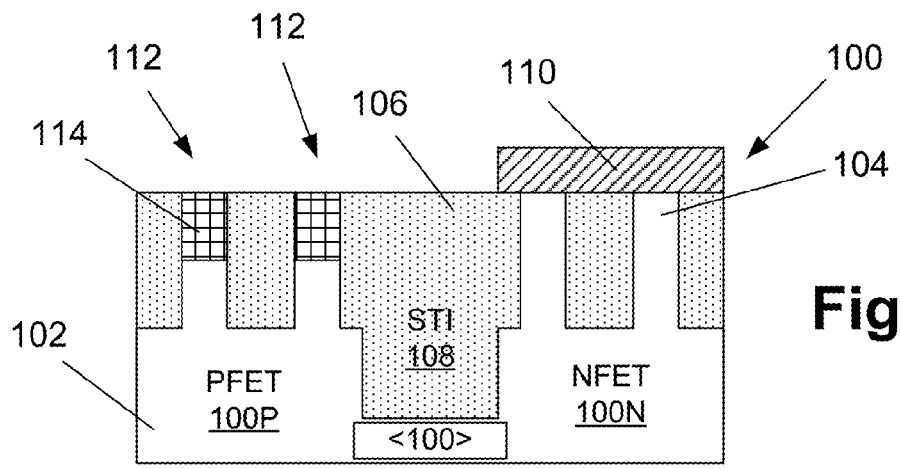

FIG. 2D depicts the device 100 after a replacement fin 114 is formed in each of the recesses 112 above the reduced height substrate fins 104 of the P-type FinFET device 100P. In one illustrative embodiment, the replacement fin 114 may be comprised of a semiconductor material that is different than the semiconductor material of the substrate 102. For example, in the case where the substrate 102 is made of silicon, the replacement fin 114 may be made of silicon/germanium, germanium, InP, InAs, GaAs, InGaAs, InSb, InGaSb, a III-V material, etc., and it may be formed on the reduced-height substrate fins 104 by performing an epitaxial growth process. In one embodiment, the epitaxial deposition process is performed until such time as the replacement fin 114 is substantially flush with the upper surface of the layer of insulating material 106.

Figure 2E:
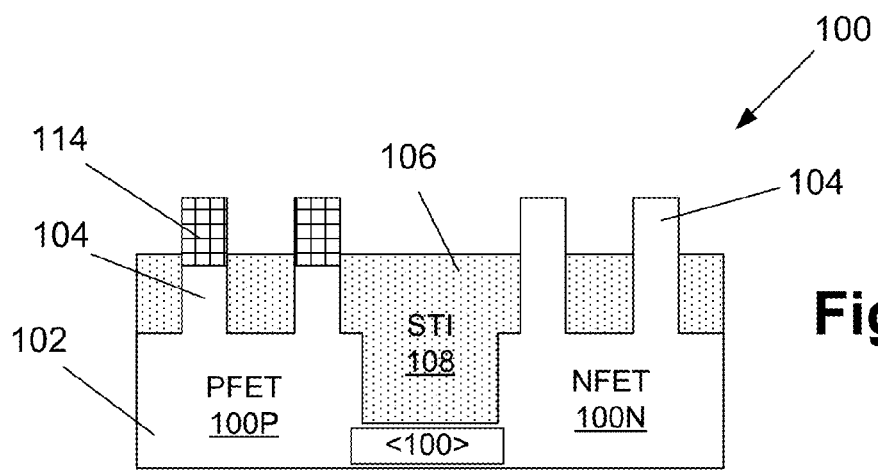

FIG. 2E depicts the device 100 after several process operations have been performed. First, the patterned masking layer 110 was removed by performing an etching process. Thereafter, another etching process was performed to reduce the height of the layer of insulating material 106. This latter etching process effectively defines the final fin height of the replacement fins 114 for the P-type FinFET device 100P and the fins 104 for the N-type FinFET device 100N. The magnitude of the final fin height may vary depending upon the particular application and, in one illustrative embodiment, may range from about 5-60 nm.

Figure 2F:
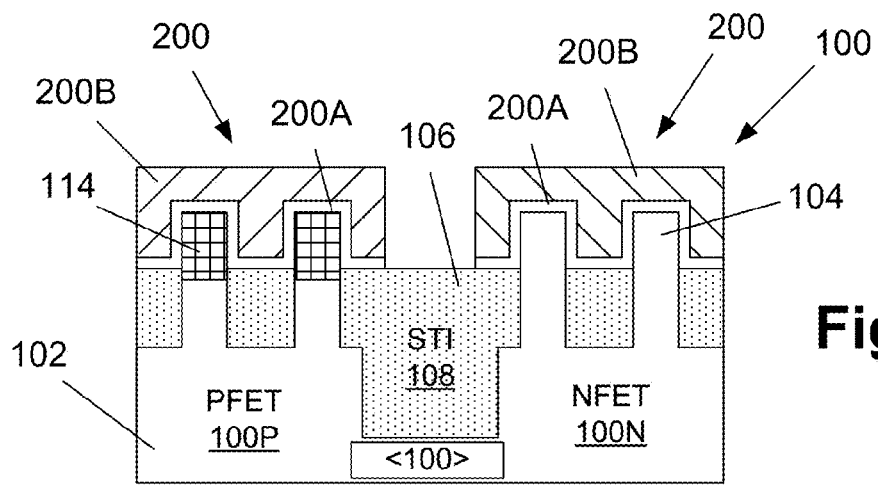

Next, as shown in FIG. 2F, schematically depicted gate structures 200 are formed on the device 100 for both the P-type FinFET device 100P and the N-type FinFET device 100N using well-known techniques. i.e., gate-first or gate-last techniques. Of course, the materials of construction used for the gate structure 200 on the P-type FinFET device 100P may be different than the materials used for the gate structure 200 on the N-type FinFET device 100N. In one illustrative embodiment, the schematically depicted gate structures 200 include an illustrative gate insulation layer 200A and an illustrative gate electrode 200B. An illustrative gate cap layer (not shown) may also be formed above the illustrative gate electrode 200B. The gate insulation layer 200A may be comprised of a variety of different materials, such as, for example, silicon dioxide, a so-called high-k (k greater than 7) insulation material (where k is the relative dielectric constant), etc. The thickness of the gate insulation layer 200A may also vary depending upon the particular application, e.g., it may have a physical thickness of about 1-2 nm. Similarly, the gate electrode 200B may also be of a variety of conductive materials, such as polysilicon or amorphous silicon, or it may be comprised of one or more metal layers that act as the gate electrode 200B. As will be recognized by those skilled in the art after a complete reading of the present application, the gate structures 200 depicted in the attached drawings, i.e., the gate insulation layer 200A and the gate electrode 200B, are intended to be representative in nature. That is, the gate structures 200 may be comprised of a variety of different materials and they may have a variety of configurations. In one illustrative embodiment, a thermal oxidation process may be performed to form a gate insulation layer 200A comprised of a semiconductor-based oxide material, such as germanium oxide, silicon dioxide, a high-k layer of insulating material, $HfO_2$, $Al_2O_3$, etc. Thereafter, the gate electrode material 200B and the gate cap layer material (not shown) may be deposited above the device 100 and the layers may be patterned using known photolithographic and etching techniques. In another illustrative embodiment, a conformal CVD or ALD process may be performed to form a gate insulation layer 200A comprised of, for example, hafnium oxide. Thereafter, one or more metal layers (that will become the gate electrode 200B) and a gate cap layer material (not shown), e.g., silicon nitride, may be deposited above the device 100.

At the point of fabrication depicted in FIG. 2F, traditional manufacturing techniques may be performed to complete the manufacture of the device 100. For example, a sidewall spacer (not shown) comprised of, for example, silicon nitride, may be formed adjacent the gate structures 200. After the spacer is formed, if desired, an epitaxial growth process may be performed to form additional semiconducting material (not shown) on the portions of the fins 114, 104 positioned outside of the spacer. Additional contacts and metallization layers may then be formed above the device 100 using traditional techniques. If desired, using the methods disclosed herein, the N-type FinFET device 100N may also be provided with replacement fins that may have a different material composition than the replacement fins 114 formed for the illustrative P-type FinFET device 100P described above.

Figure 3A:
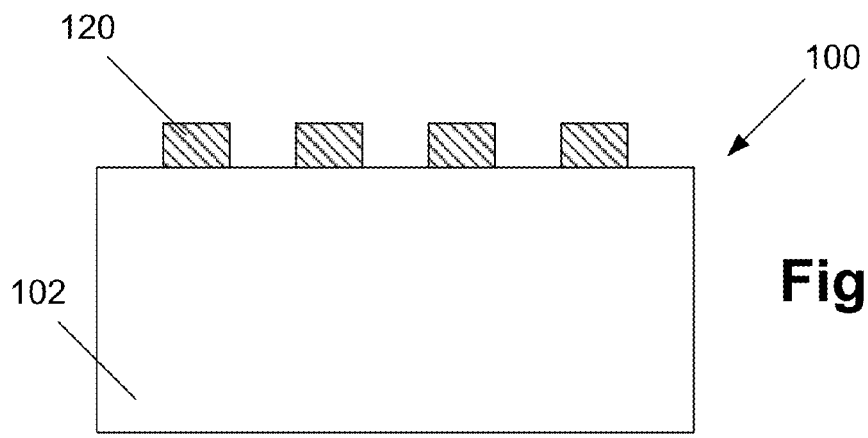
FIGS. 3A-3G depict yet other illustrative novel methods disclosed herein for forming low or substantially defect-free replacement fins for a FinFET semiconductor device, and various embodiments of the resulting novel devices.
Figure 3B:
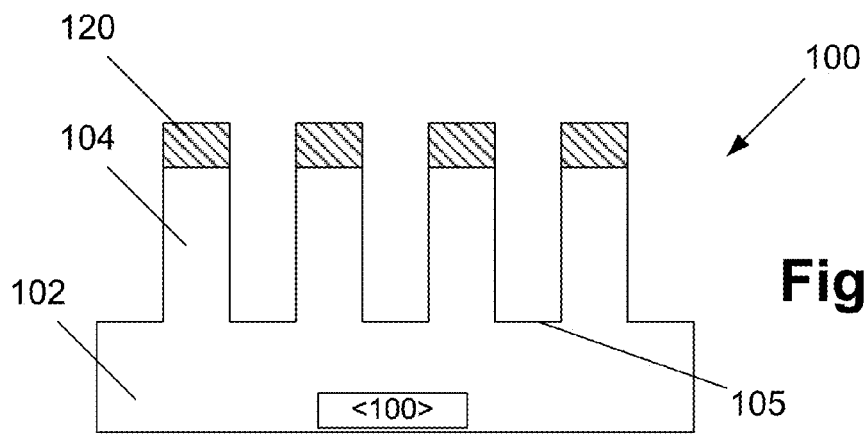
Figure 3C:
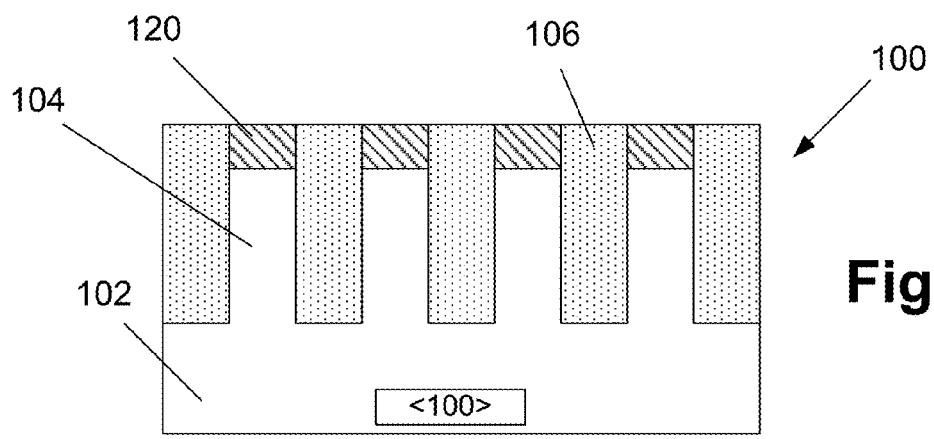

FIGS. 3A-3G depict yet other illustrative novel methods disclosed herein for forming low or substantially defect-free replacement fins for a FinFET semiconductor device, and various embodiments of the resulting novel devices. FIG. 3A depicts another illustrative embodiment of the device 100 disclose herein at a point in fabrication wherein a patterned mask layer 120 has been formed above the substrate 102. The patterned masking layer 120 may be comprised of the same materials as those described above for the patterned masking layer 110. FIG. 3B depicts the device after one or more etching processes were performed on the substrate 102 through a patterned mask layer 120 to define a plurality of trenches 105 in the substrate 102. As before, the formation of the trenches 105 results in the formation of a plurality of substrate fins 104. Thereafter, as shown in FIG. 3C, the trenches 105 were overfilled with an insulating material 106 and a planarization process, e.g., a CMP process or an etch-back process, was performed to planarize the upper surface of the layer of insulating material 106 with the upper surface of the substrate fins 104.

Figure 3D:
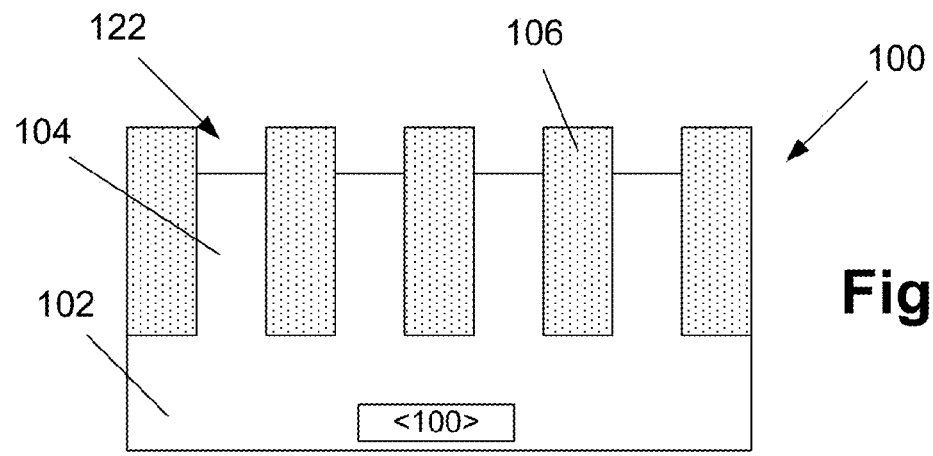
Figure 3E:
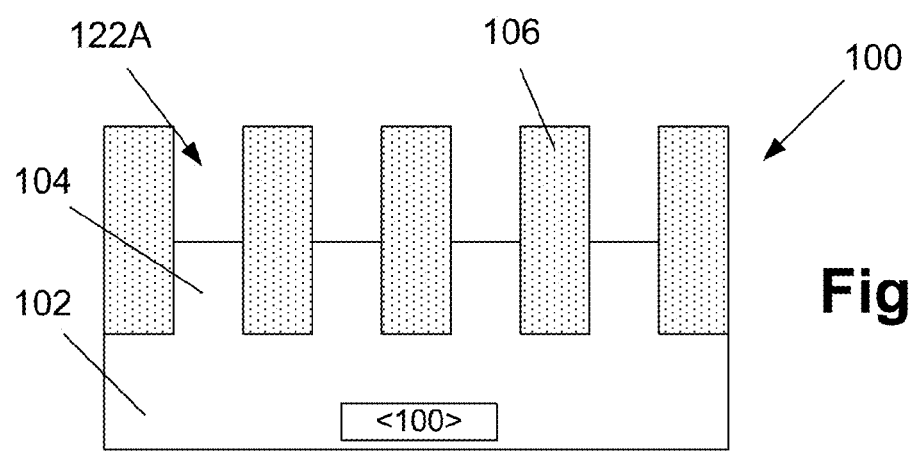
Figure 3F:
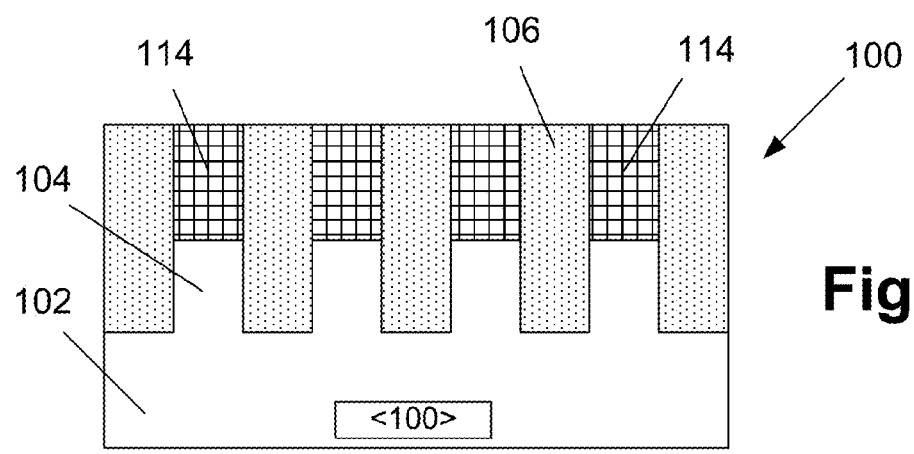
Figure 3G:
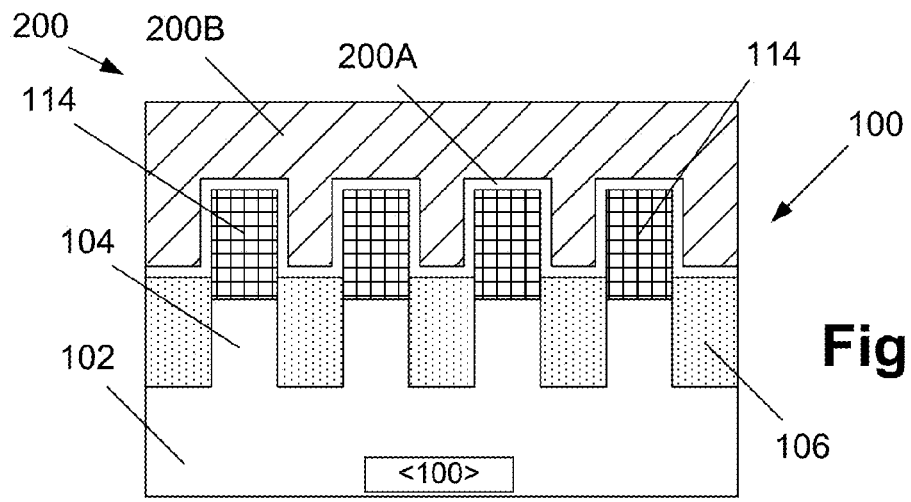

FIG. 3D depicts the device 100 after an etching process was performed to remove the patterned mask layer 120 from above the substrate fins 104. This etching process results in the formation of recesses 122 that expose the substrate fins 104 for further processing. In one illustrative example, the recess 122 may a depth on the order of about 5-40 nm and an aspect ratio on the order of about 5:1. FIG. 3E depicts the device 100 after another etching process was performed to reduce the height of the exposed substrate fins 104. This etching process results in the formation of recesses 122A that may have a depth on the order of about 5-60 nm and an aspect ratio on the order of about 8:1. FIG. 3F depicts the device 100 after the above-described replacement fins 114 are formed in the recesses 122A above the reduced height substrate fins 104. FIG. 3G depicts the device 100 after several process operations have been performed. First, another etching process was performed to reduce the height of the layer of insulating material 106. This latter etching process effectively defines the final fin height of the replacement fins 114 for the device 100. Thereafter, the above-described gate structure 200 was formed on the device 100. At the point of fabrication depicted in FIG. 3G, traditional manufacturing techniques may be performed to complete the manufacture of the device 100.

Figure 4A:
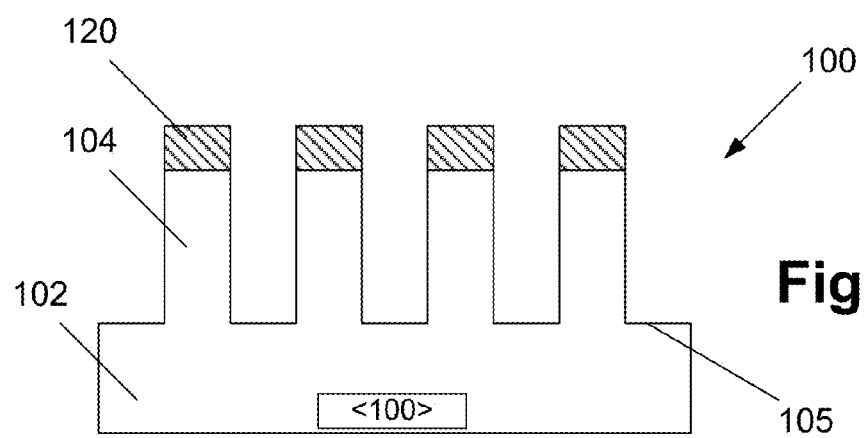
FIGS. 4A-4F depict other illustrative embodiments of the novel methods disclosed herein for forming low or substantially defect-free replacement fins for a FinFET semiconductor device, and various embodiments of the resulting novel devices.
Figure 4B:
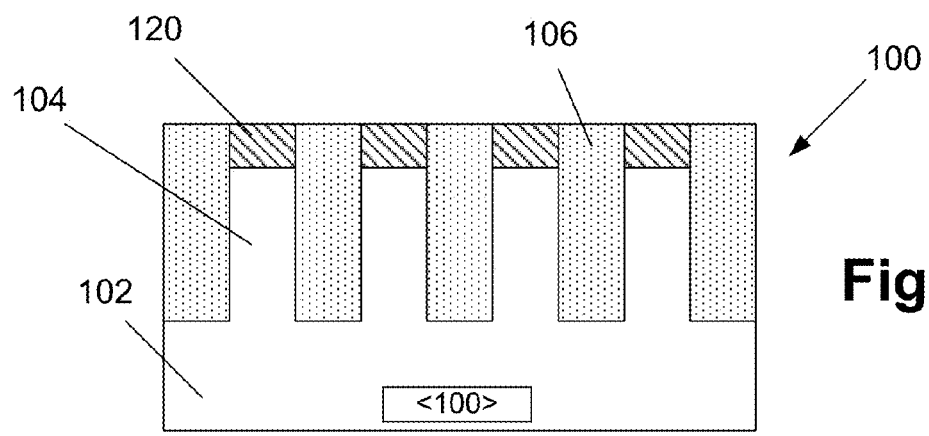

FIGS. 4A-4F depict other illustrative embodiments of the novel methods disclosed herein for forming low or substantially defect-free replacement fins for a FinFET semiconductor device, and various embodiments of the resulting novel devices. FIG. 4A depicts another illustrative embodiment of the device 100 disclosed herein at a point in fabrication wherein one or more etching processes were performed on the substrate 102 through the patterned mask layer 120 to define a plurality of trenches 105 in the substrate 102. As before, the formation of the trenches 105 results in the formation of a plurality of substrate fins 104. Thereafter, as shown in FIG. 4B, the trenches 105 were overfilled with an insulating material 106 and a planarization process, e.g., a CMP process or an etch-back process, was performed to planarize the upper surface of the layer of insulating material 106 with the upper surface of the substrate fins 104.

Figure 4C:
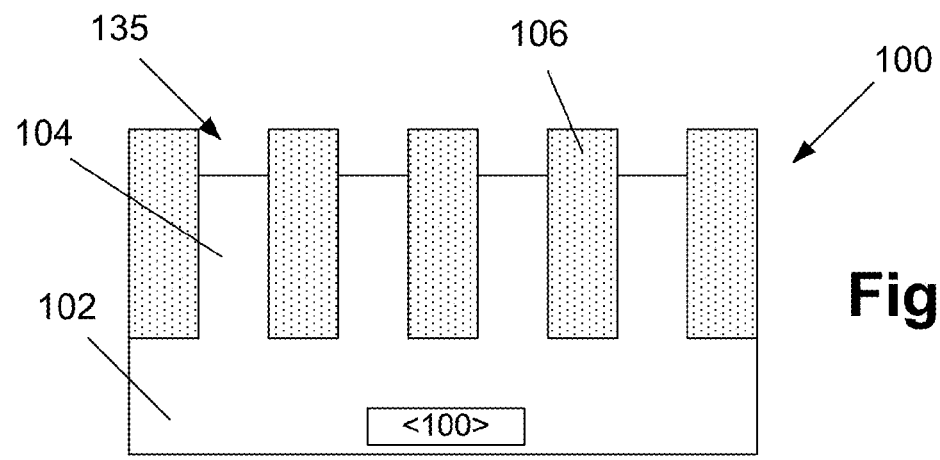
Figure 4D:
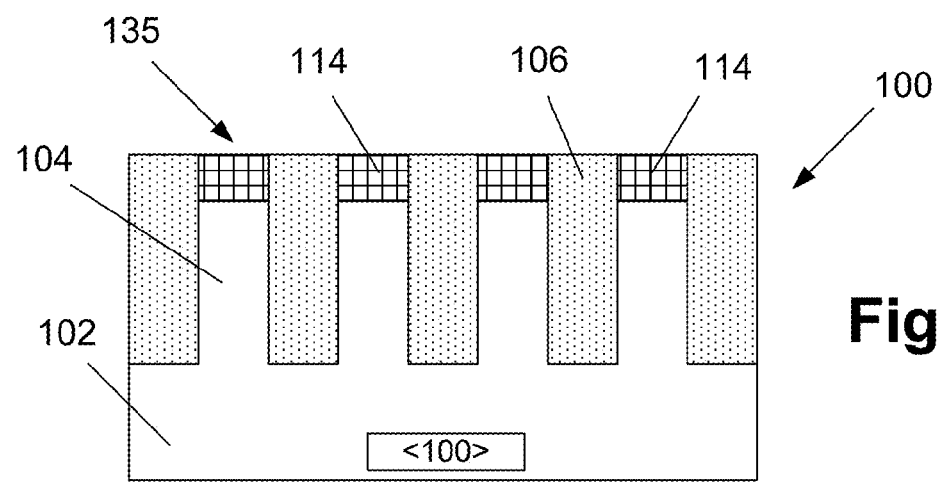
Figure 4E:
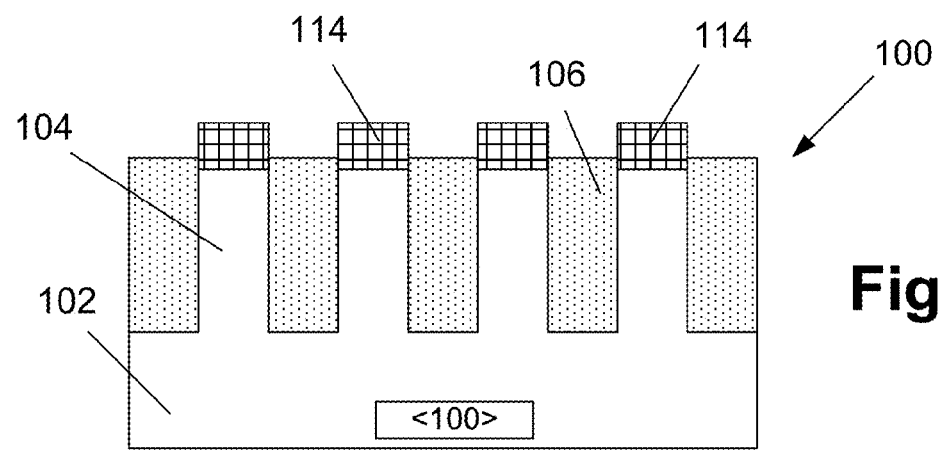
Figure 4F:
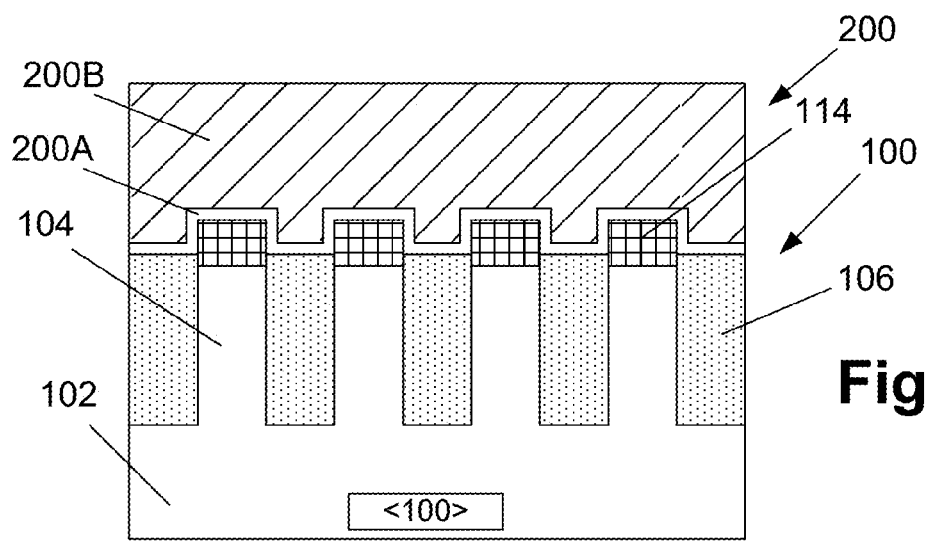

FIG. 4C depicts the device 100 after an etching process was performed to remove the patterned mask layer 120 from above the substrate fins 104. This etching process results in the formation of recesses 135 that expose the substrate fins 104 for further processing. In one illustrative example, the recess 135 may have a depth on the order of about 5-60 nm and an aspect ratio on the order of about 5:1. FIG. 4D depicts the device 100 after the above-described replacement fins 114 are formed in the recesses 135 above the substrate fins 104. FIG. 3E depicts the device 100 after another etching process was performed to reduce the height of the layer of insulating material 106. This latter etching process effectively defines the final fin height of the replacement fins 114 for the device 100. Thereafter, as shown in FIG. 4F, the above-described gate structure 200 was formed on the device 100. At the point of fabrication depicted in FIG. 4F, traditional manufacturing techniques may be performed to complete the manufacture of the device 100.

Figure 5A:
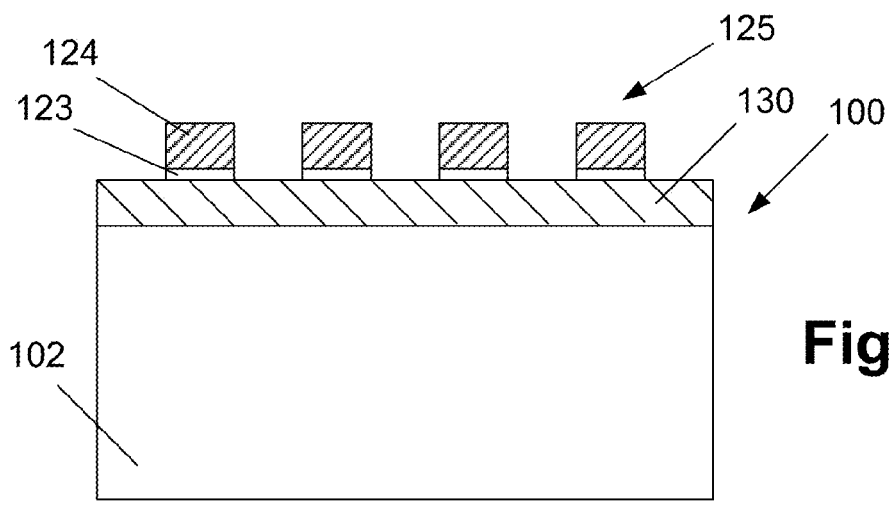
FIGS. 5A-5H depict additional illustrative embodiments of the novel methods disclosed herein for forming low or substantially defect-free replacement fins for a FinFET semiconductor device, and various embodiments of the resulting novel devices.
Figure 5B:
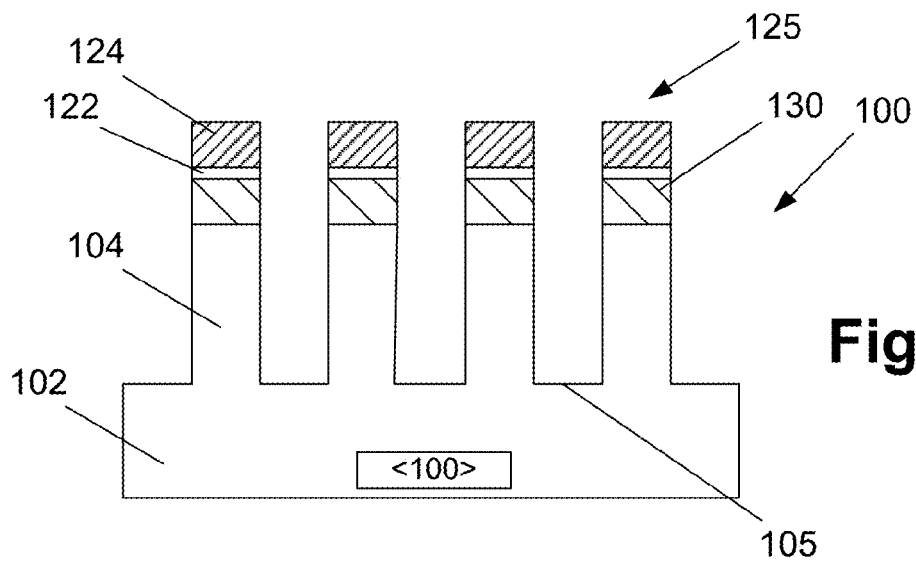
Figure 5C:
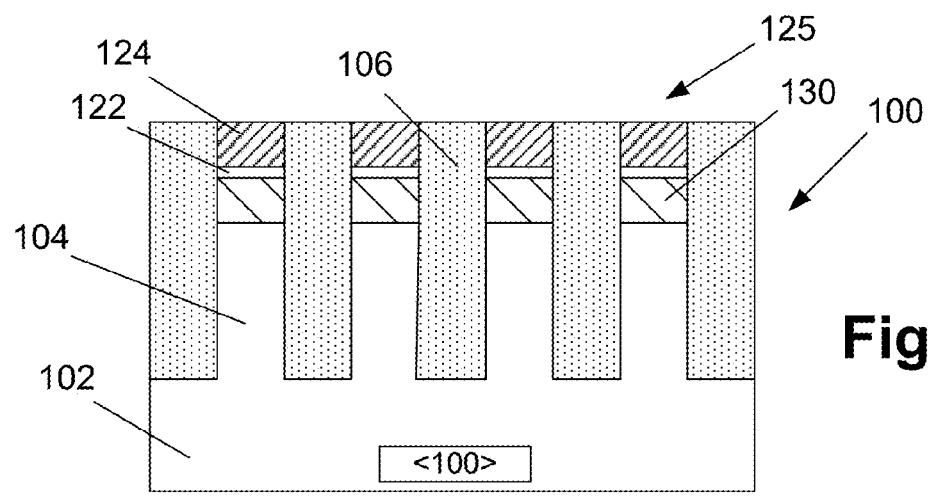

FIGS. 5A-5H depict additional illustrative embodiments of the novel methods disclosed herein for forming low or substantially defect-free replacement fins for a FinFET semiconductor device, and various embodiments of the resulting novel devices. FIG. 5A depicts another illustrative embodiment of the device 100 disclose herein at a point in fabrication wherein a fully strained layer of silicon/germanium 130 (SiGe$_{0.5}$) was formed on the substrate 102 and after a patterned mask layer 125 was formed above the layer of silicon/germanium 130. In this example, the patterned mask layer 125 is comprised of a layer of silicon dioxide 123 (a pad oxide) and a layer of silicon nitride 124 (a pad nitride). FIG. 5B depicts the device 100 after one or more etching processes were performed on the layer of silicon/germanium 130 and the substrate 102 through the patterned mask layer 125 to define a plurality of trenches 105 in the substrate 102. As before, the formation of the trenches 105 results in the formation of a plurality of substrate fins 104. Thereafter, as shown in FIG. 5C, the trenches 105 were overfilled with the insulating material 106 and a planarization process, e.g., a CMP process or an etch-back process, was performed to planarize the upper surface of the layer of insulating material 106 with the upper surface of the patterned masking layer 125.

Figure 5D:
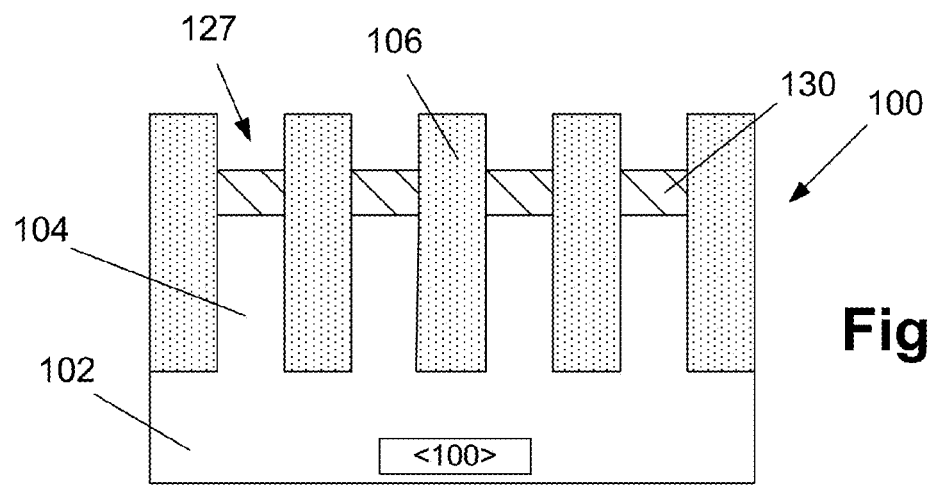
Figure 5E:
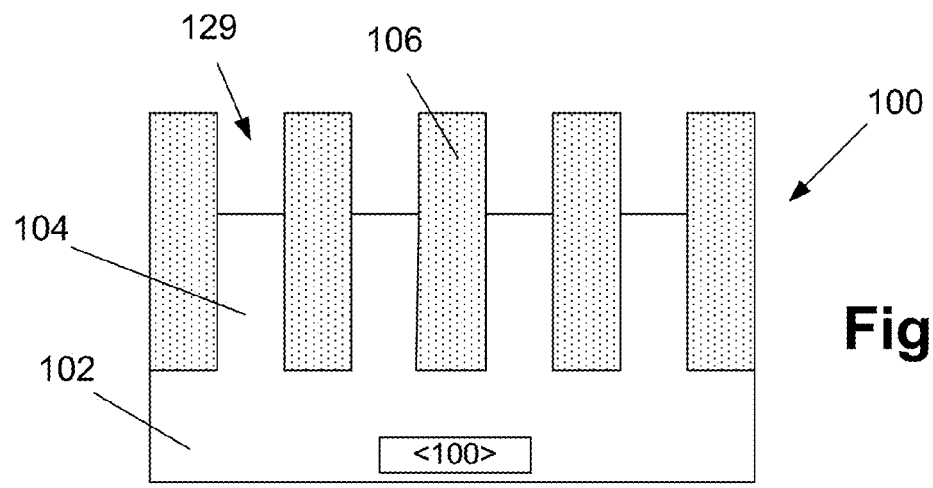
Figure 5F:
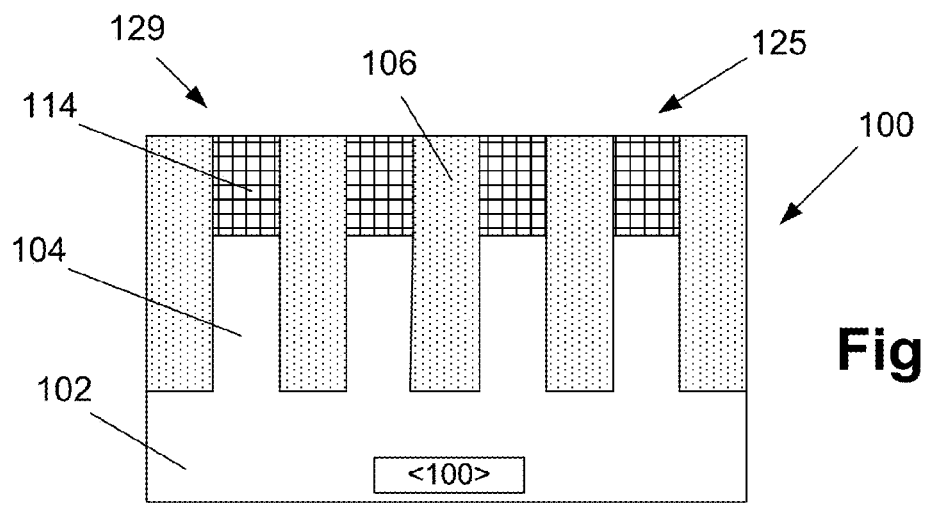
Figure 5G:
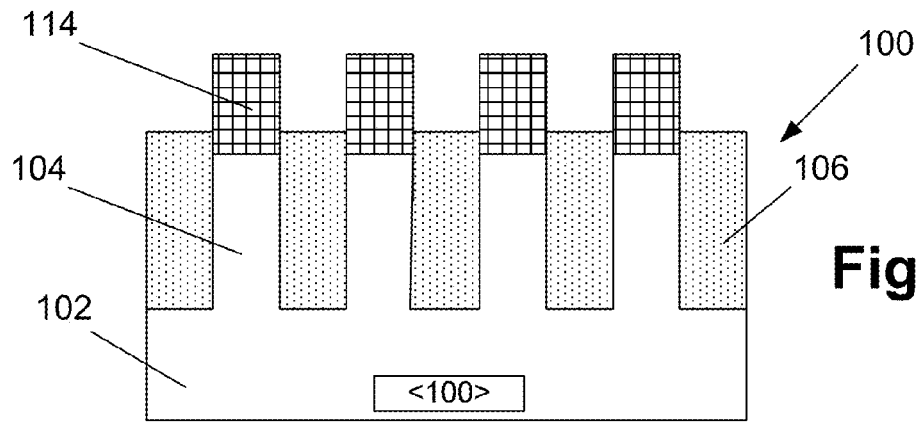
Figure 5H:
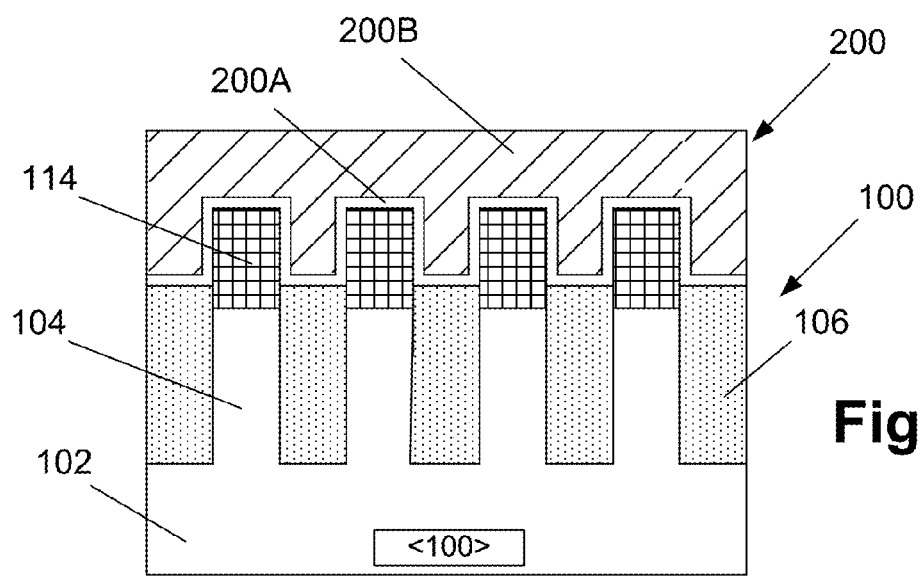

FIG. 5D depicts the device 100 after one or more etching processes were performed to remove the patterned masking layer 125 from above the substrate fins 104. This etching process results in the formation of recesses 127 that expose the layer of silicon/germanium 130 for further processing. In one illustrative example, the recesses 127 may have a depth on the order of about 5-40 nm and an aspect ratio on the order of about 5:1. FIG. 5E depicts the device 100 after another etching process was performed to remove the silicon/germanium layer 130. This etching process results in the formation of recesses 129 that expose the substrate fins 104. The recesses 129 may have a depth on the order of about 40-60 nm and an aspect ratio on the order of about 8:1. FIG. 5F depicts the device 100 after the above-described replacement fins 114 are formed in the recesses 129 above the substrate fins 104. FIG. 5G depicts the device 100 after an etching process was performed to reduce the height of the layer of insulating material 106. This latter etching process effectively defines the final fin height of the replacement fins 114 for the device 100. Thereafter, as shown in FIG. 5H, the above-described gate structure 200 was formed on the device 100. At the point of fabrication depicted in FIG. 5H, traditional manufacturing techniques may be performed to complete the manufacture of the device 100.

Figure 6A:
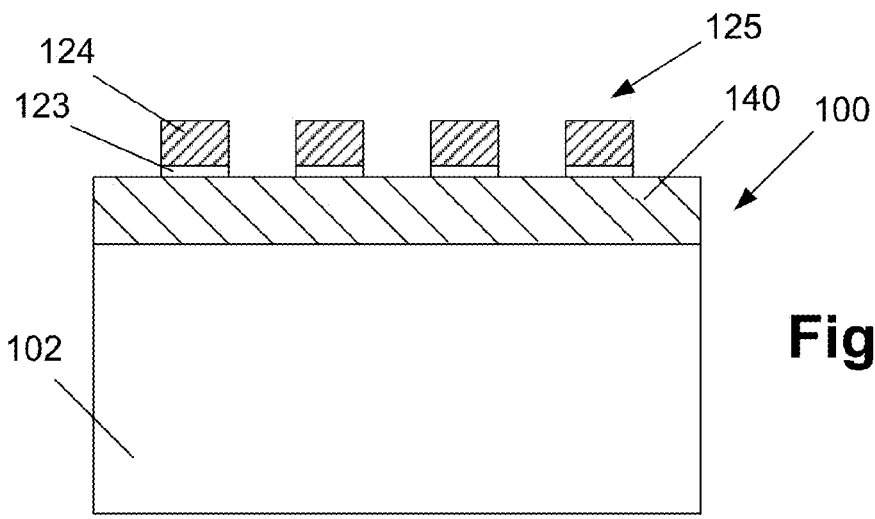
FIGS. 6A-6H depict yet other illustrative embodiments of the novel methods disclosed herein for forming low or substantially defect-free replacement fins for a FinFET semiconductor device, and various embodiments of the resulting novel devices.
Figure 6B:
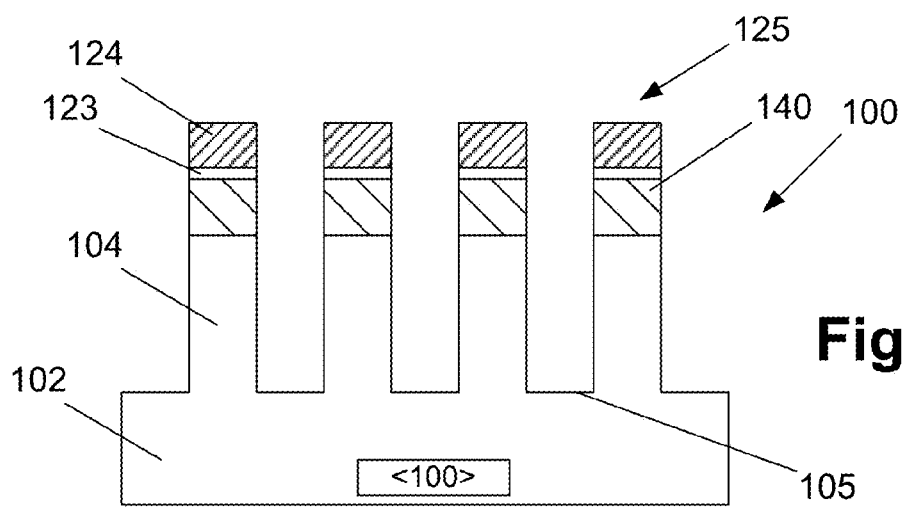
Figure 6C:
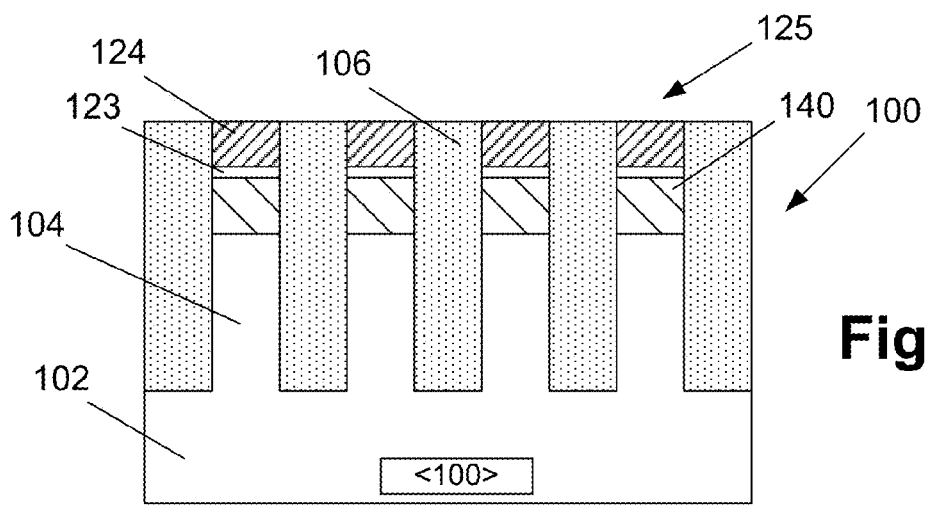

FIGS. 6A-6H depict yet other illustrative embodiments of the novel methods disclosed herein for forming low or substantially defect-free replacement fins for a FinFET semiconductor device, and various embodiments of the resulting novel devices. FIG. 6A depicts another illustrative embodiment of the device 100 disclosed herein at a point in fabrication wherein a fully strained layer of silicon/germanium 140 (SiGe$_{0.5}$) was formed on the substrate 102 and after the above-described patterned mask layer 125 was formed above the layer of silicon/germanium 140. FIG. 6B depicts the device 100 after one or more etching processes were performed on the layer of silicon/germanium 140 and the substrate 102 through the patterned mask layer 125 to define a plurality of trenches 105 in the substrate 102. As before, the formation of the trenches 105 results in the formation of a plurality of substrate fins 104. Thereafter, as shown in FIG. 6C, the trenches 105 were overfilled with the insulating material 106 and a planarization process, e.g., a CMP process or an etch-back process, was performed to planarize the upper surface of the layer of insulating material 106 with the upper surface of the patterned masking layer 125.

Figure 6D:
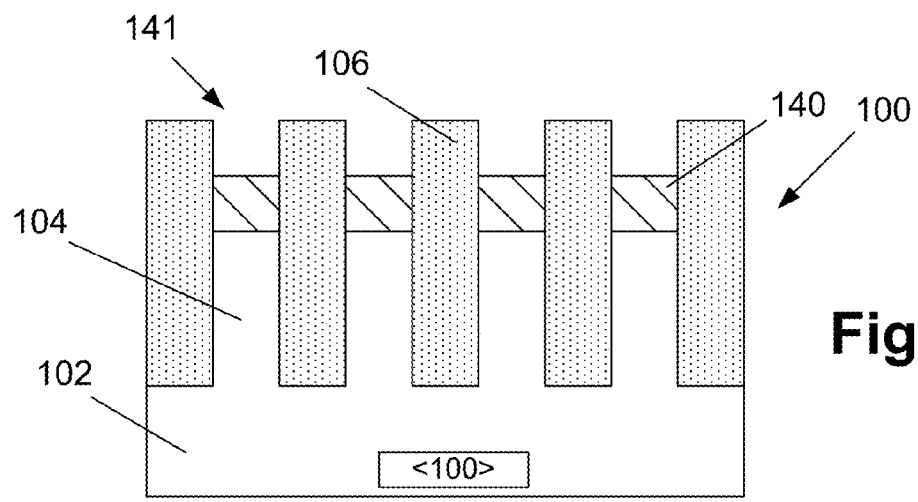
Figure 6E:
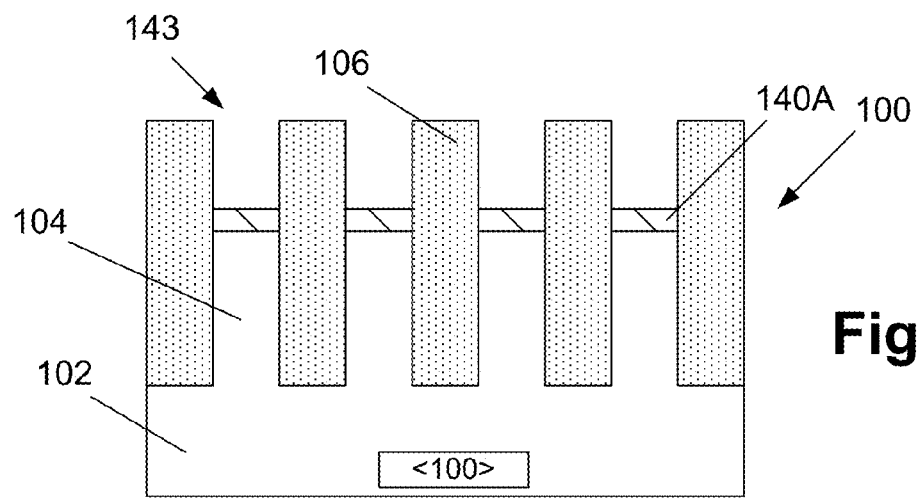
Figure 6F:
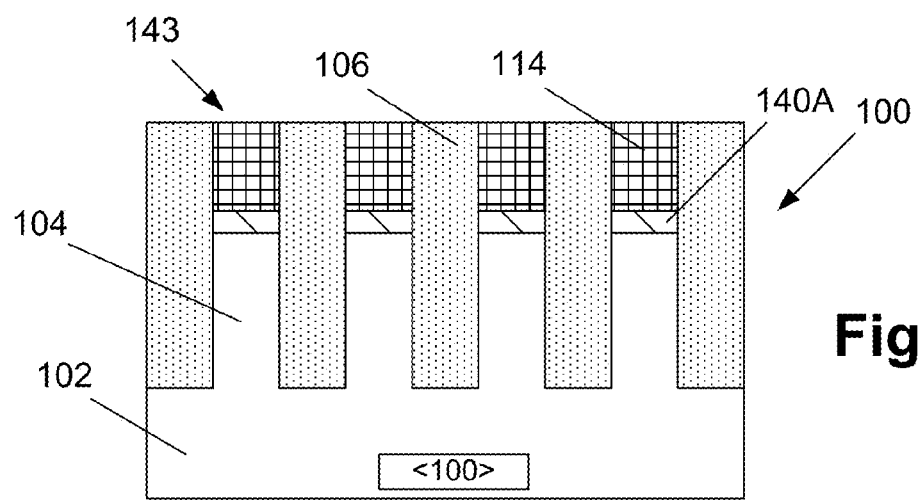
Figure 6G:
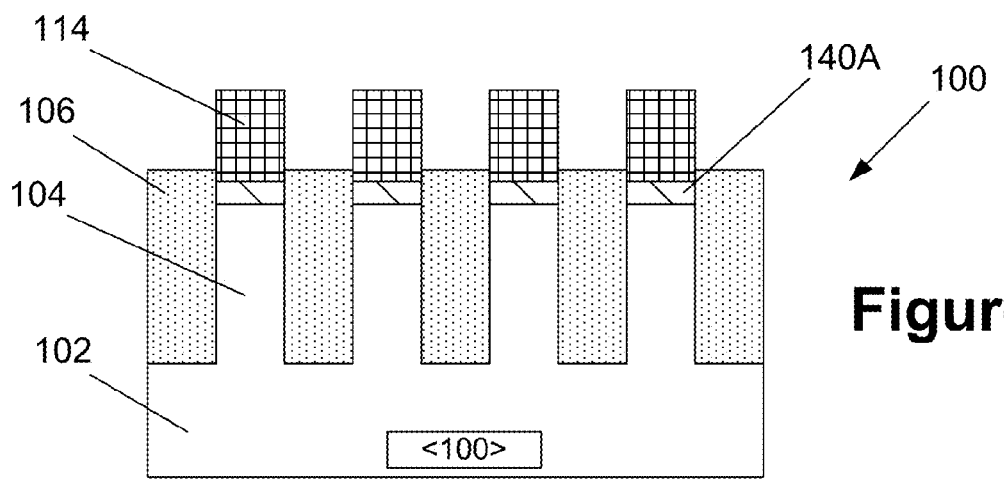
Figure 6H:
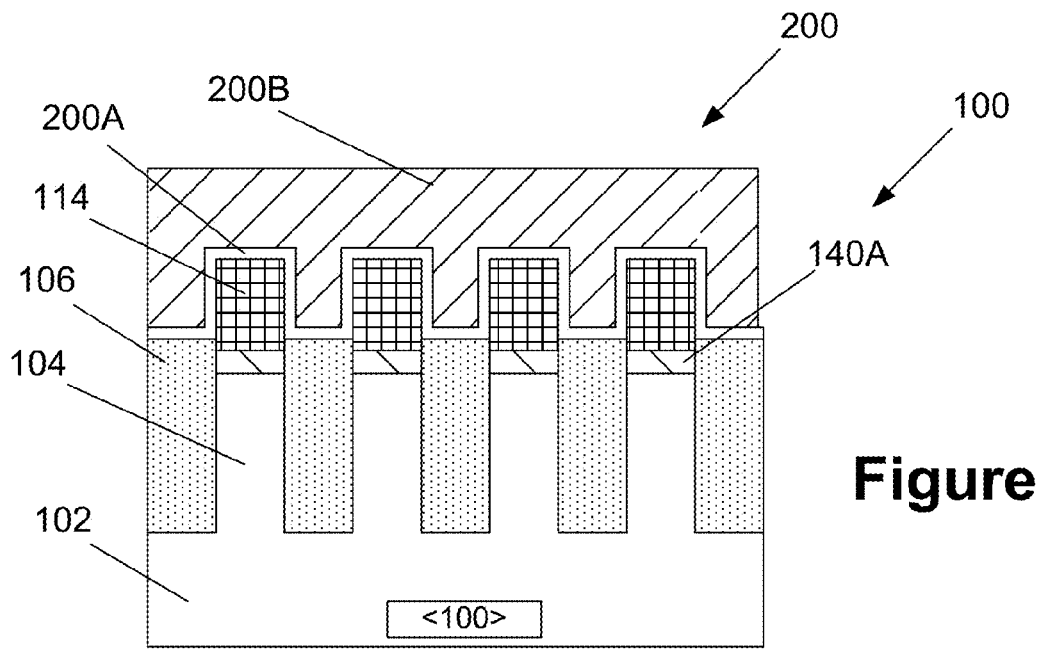

FIG. 6D depicts the device 100 after one or more etching processes were performed to remove the patterned masking layer 125 from above the silicon/germanium layer 140. This etching process results in the formation of recesses 141 that expose the layer of silicon/germanium 140 for further processing. In one illustrative example, the recesses 141 may have a depth on the order of about 20-40 nm and an aspect ratio on the order of about 5:1. FIG. 6E depicts the device 100 after another etching process was performed to remove portions, but not all, of the silicon/germanium layer 140, i.e., portions 140A of the silicon/germanium layer 140 remain positioned above the substrate fins 104. This etching process results in the formation of recesses 143 which may have a depth on the order of about 40-60 nm and an aspect ratio on the order of about 8:1. FIG. 6F depicts the device 100 after the above-described replacement fins 114 are formed in the recesses 143 on the remaining portions 140A of the layer of silicon/germanium 140. The presence of the remaining portions 140A of the layer of silicon/germanium acts as a buffer that may improve the crystal quality of the replacement fin material 114. FIG. 6G depicts the device 100 after an etching process was performed to reduce the height of the layer of insulating material 106. This latter etching process effectively defines the final fin height of the replacement fins 114 for the device 100. Thereafter, as shown in FIG. 6H, the above-described gate structure 200 was formed on the device 100. At the point of fabrication depicted in FIG. 6H, traditional manufacturing techniques may be performed to complete the manufacture of the device 100.

As will be appreciated by those skilled in the art after a complete reading of the present application, the methods disclosed herein are broadly directed to various methods of forming substantially defect-free replacement fins for a FinFET device. The formation of such defect-free replacement fin structures enables the formation of devices and circuits that may operate at higher efficiencies as compared to prior art devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   a substrate fin formed in a bulk semiconductor substrate comprising a first semiconductor material having a crystalline structure;
   a second semiconductor material positioned above said substrate fin;
   an upper fin structure positioned on and in contact with said second semiconductor material, said upper fin structure comprising a third semiconductor material that is different from said second semiconductor material;
   a layer of insulating material disposed on said substrate and covering sidewalls of said substrate fin, said second semiconductor material, and only a portion of sidewalls of said upper fin structure; and
   a gate structure positioned above said layer of insulating material and around at least a portion of said upper fin structure, wherein a portion of said second semiconductor material extends along a length of said substrate fin and below said gate structure, and said gate structure contacts said upper fin structure without contacting a portion of said second semiconductor material disposed below said gate structure.

2. The device of claim 1, wherein said bulk semiconductor substrate comprises a (100) bulk semiconductor substrate, and said substrate fin has a long axis that is positioned in a <100> crystallographic direction of said (100) bulk semiconductor substrate.

3. The device of claim 1, wherein said upper fin structure comprises one of SiGe, Ge, InP, InAs, GaAs, InGaAs, InSb, InGaSb or a III-V material.

4. The device of claim 3, wherein said bulk semiconductor substrate is silicon.

5. The device of claim 1, wherein said bulk semiconductor substrate is silicon and said upper fin structure comprises SiGe.

6. The device of claim 1, wherein said second semiconductor material comprises SiGe.

7. A device, comprising:
   a substrate fin formed in a (100) bulk semiconductor substrate comprising a first semiconductor material having a crystalline structure, wherein at least a sidewall of said substrate fin is positioned substantially in a <100> crystallographic direction of said crystalline structure of said bulk semiconductor substrate;
   a second semiconductor material positioned above said substrate fin;
   an upper fin structure positioned on and in contact with said second semiconductor material, said upper fin structure comprising a third semiconductor material that is different from said second semiconductor material;
   a layer of insulating material disposed on said substrate and covering sidewalls of said substrate fin, said second semiconductor material, and only a portion of sidewalls of said upper fin structure; and
   a gate structure positioned around at least a portion of said upper fin structure, wherein a portion of said second semiconductor material extends along a length of said substrate fin and below said gate structure, and said gate structure contacts said upper fin structure without contacting a portion of said second semiconductor material disposed below said gate structure.

8. The device of claim 7, wherein said substrate fin has a long axis that is positioned in a <100> crystallographic direction of said (100) bulk semiconductor substrate.

9. The device of claim 7, wherein said upper fin structure comprises one of SiGe, Ge, InP, InAs, GaAs, InGaAs, InSb, InGaSb or a III-V material.

10. The device of claim 9, wherein said (100) bulk semiconductor substrate is silicon.

11. The device of claim 7, wherein said (100) bulk semiconductor substrate is silicon and said upper fin structure comprises SiGe.

12. The device of claim 7, wherein said second semiconductor material comprises SiGe.

13. A method of forming a FinFET device, comprising:
    forming a substrate fin in a bulk semiconductor substrate comprising a first semiconductor material;
    forming a second semiconductor material above said substrate fin;
    forming a replacement fin structure on and in contact with said second semiconductor material, said replacement fin structure comprising a third semiconductor material that is different from said second semiconductor material;
    forming a layer of insulating material on said substrate and covering sidewalls of said substrate fin, said second semiconductor material, and only a portion of sidewalls of said replacement fin structure; and
    forming a gate structure around at least a portion of said replacement fin structure, wherein a portion of said second semiconductor material extends along a length of said substrate fin and below said gate structure and said gate structure contacts said replacement fin structure without contacting a portion of said second semiconductor material disposed below said gate structure.

14. The method of claim 13, wherein said bulk semiconductor substrate comprises a (100) bulk semiconductor substrate, and said substrate fin is formed such that a long axis of said substrate fin is positioned in a <100> crystallographic direction of said (100) bulk semiconductor substrate.

15. The method of claim 13, wherein forming said substrate fin comprises:
    forming a layer of said second semiconductor material above said bulk semiconductor substrate;
    forming a patterned masking layer above said layer of said second semiconductor material; and
    etching said layer of said second semiconductor material and said bulk semiconductor substrate in the presence of said patterned masking layer to define said substrate fin.

16. The method of claim 15, further comprising removing a portion of said layer of said second semiconductor material after etching said layer of said second semiconductor material and said bulk semiconductor substrate prior to forming said replacement fin structure.

17. The method of claim 13, wherein said replacement fin comprises one of SiGe, Ge, InP, InAs, GaAs, InGaAs, InSb, InGaSb or a III-V material.

18. The method of claim 13, wherein said replacement fin comprises a material different than SiGe.

* * * * *